United States Patent
Meyyappan et al.

(10) Patent No.: US 7,596,773 B2
(45) Date of Patent: Sep. 29, 2009

(54) AUTOMATING OPTIMAL PLACEMENT OF MACRO-BLOCKS IN THE DESIGN OF AN INTEGRATED CIRCUIT

(75) Inventors: Thenappan Meyyappan, Sivaganga (IN); Senthil Arasu Thirunavukarasu, Coimbatore (IN); Sreekantha Madhava katla, Bangalore (IN); Ramesh S Guzar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 402 days.

(21) Appl. No.: 11/307,992

(22) Filed: Mar. 2, 2006

(65) Prior Publication Data

US 2007/0220470 A1 Sep. 20, 2007

(51) Int. Cl.
G06F 17/50 (2006.01)
G06F 9/45 (2006.01)
(52) U.S. Cl. ............................................. 716/10; 716/9
(58) Field of Classification Search .................. 716/9–10
See application file for complete search history.

(56) References Cited

U.S. PATENT DOCUMENTS 6,493,658 B1 * 12/2002 Koford et al. .................. 703/1

OTHER PUBLICATIONS

Gopalakrishnan Vijayan and Ren-Song Tsay, "A New Method for Floor Planning Using Topological Constraint Reduction"; IEEE Transactions on Computer-Aided Design, vol. IO, No. 12, Dec. 1991, pp. 1494-1501.

Stelian Alupoaei and Srinivas Katkoori; "Ant Colony System Application to Macrocell Overlap Removal", IEEE Transactions on Very Large Scale Integration (VLSI) Systems, vol. 12, No. 10, Oct. 2004, pp. 1118-1122.

Sudip Nag and Kamal Chaudhary, "Post-placement residual-overlap removal with minimal movement", 1999, pp. 1-6, Xilinx Inc, 2100 Logic Drive, San Jose CA 95124.

Lucabenini, Deisuniversit Adibologna, Albertomacii, Politecnicoditorino, Massimoponcino,"Energy-AwareDesignofEmbeddedMemories:A Survey of Technologies" , ACM Transactionson Embedded Computing Systems, vol. 2, No. 1, Feb. 2003, pp. 5-32.

Saurabhn.Adya and Igor L. Markov,"Consistent PlacementofMacro-Blocks Using Floor planning and Standard-Cell Placement", pp. 1-6, ISPD'02,Apr. 7-10, 2002,SanDiego,California,USA.

(Continued)

Primary Examiner—Jack Chiang
Assistant Examiner—Suresh Memula
(74) Attorney, Agent, or Firm—Dawn V. Stephens; Wade James Brady, III; Frederick J. Telecky, Jr.

(57) ABSTRACT

Automating optimal placement of macro-blocks in the design of an integrated circuit. A first set of placements is generated and corresponding measures of optimalness for each placement is computed. A new set of placements is generated, with each placement being generated from multiple ("chosen placements") of the first set of placements. The position of each macro in the new placement is made to be at least substantially identical to the position of the corresponding macro in one of the chosen placements. The placements having high values of optimalness are selected to be the chosen placements, thereby causing the properties of desirable placements to be propagated to new set of placements, as is common in genetic evolution. Another aspect of the present invention enables automatic removal of overlaps in a placement.

16 Claims, 11 Drawing Sheets

OTHER PUBLICATIONS

S. N. Adya and I. L. Markov; "Combinatorial Techniques for Mixed-Size Placement", ACM Transactions on Design Automation of Electronic Systems, vol. 10, No. 1, Jan. 2005, pp. 58-90. ACM, Inc., 1515, Broadway, New York, NY 10036 USA.

Andrew B. Kahng, "Classical Floor planning Harmful?", ISPD 2000, San Diego, CA, pp. 207-213; UCLA Computer Science Department, 3713 Boelter Hall, Los Angeles, CA 90095-1596 USA.

Jarrod A. Roy, David A. Papa, Saurabhn.Adya, Hayward H. Chan, Aaron N. Ng, James F. Lu, Igor L. Markov, "Capo: Robust and Scalable Open—Source Min-Cut Floor placer" pp. 1-3, ISPD '05, Apr. 3-6, 2005, San Francisco, California, USA. University of Michigan, EECS Department, Ann Arbor, MI 48109-2122, Synplicity Inc., 600W. California Ave., Sunnyvale, CA 95054.

Ateen Khatkhate, Chen Li, Ameya R. Agnihotri, Mehmet C.Yildiz, Satoshi Ono, Cheng-Kok Koh Patrick H. Madden, "Recursive Bisection Based Mixed Block Placement", pp. 84-89, ISPD'04 Apr. 18-21, 2004, Phoenix, Arizona, USA.

The International Technology Roadmap for Semiconductors by SIA Backgrounders, The ITRS 2003 Update is available at: http://public.itrs.net, Aug. 2005, pp. 1-4, National Science Foundation, Survey of Federal Funds for Research and Development.

Xiaojian Yang Bo-Kyung Choi Majid Sarrafzadeh, Routability Driven White Space Allocation for Fixed-Die Standard-Cell Placement, ISPD'02, Apr. 7-10, 2002, San Diego, California, USA. pp. 42-47, Computer Science Department, University of California at Los Angeles, Los Angeles, CA 90095.

Chin-Chih Chang†, Jason Cong and Xin Yuan, "Multi-level Placement for Large-Scale Mixed-Size 1C Designs" pp. 1-6, Jan. 2003, Department of Computer Science, University of California, Los Angeles.

Olivier Coudert, "Timing and Design Closure in Physical Design Flows", Computer Society, pp. 1-6, 2002 IEEE, Proceedings of the International Symposium on Quality Electronic Design (ISQED'02).

Saurabh N. Adya, Igor L. Markov and Paul G. Villarrubia, "On Whitespace and Stability in Mixed-Size Placement and Physical Synthesis", 2003 ACM, pp. 311-318, Proceedings of the International Conference on Computer Aided Design (ICCAD'03).

Jason Cong and Majid Sarrafzadeh, "Incremental Physical Design" pp. 1-9, ISPD 2000, San Diego, CA.

Carlos M. Fonseca and Peter J. Fleming, "An Overview of Evolutionary Algorithms in Multiobjective Optimization", May 19, 1995, pp. 1-25, The University of Sheffield Department of Automatic Control and Systems Engineering, Mappiii Street Sheffield SI 3JD, U.K.

Carlosa. Coello Coello, "An Updated Survey of GA-Based Multi objective Optimization Techniques", GA-Based Optimization Techniques, pp. 109-143, ACM Computing Surveys, vol. 32, No. 2, Jun. 2000.

Junaid A. Khan and Sadiq M. Salt, "Fuzzy Aggregating Functions for Multiobjective VLSI Placement", 2002 IEEE, pp. 831-836, Department of Computer Engineering, King Fahd University of Petroleum & Minerals, Dharan 31261, Saudi Arbia.

Eugene Shragowitz, Habib Youssef, Sadiq M. Salt and Hakim Adiche, "Fuzzy Genetic Algorithm for Floor planning", SPIE -1997, pp. 36-47, Department of Computer Science, University of Minnesota, Minneapolis, Minnesota, 55455 USA 6King Fahd University of Petroleum and Minerals, P.O. Box 1734, Dhahran-31261, Saudi Arabia.

Sudip Nag and Kamal Chaudhary, "Post-placement residual-overlap removal with minimal movement", pp. 1-6; 1999, Xilinx Inc, 2100 Logic Drive, San Jose CA 95124.

Hiroshi Murata, Kunihiro Fujiyoshi, Shigetoshi Nakatake, and Yoji Kajitani; Rectangle-Packing-Based Module Placement, 1995, pp. 1-8, School of Information Science, Japan Advanced Institute of Science and Technology, Tatsunokuchi, Ishikawa 923-12, Japan, Department of Electrical and Electronic Engineering, Tokyo Institute of Technology, Meguro-ku, Tokyo 152, Japan.

Saurabh N. Adya and Igor L. Markov, "Fixed -outline Floor planning Through Better Local Search", 2001, pp. 1-11, Univ. of Michigan, EECS department, Ann Arbor, MI 48109-2122.

Jiaji Fang, Joshua S. L. Wong, Kaihe Zhang and Pushan Tang, A New Fast Constraint Graph Generation Algorithm for Vlsi Layout Compaction, from IEEE Journal, Jun. 1991, pp. 2858-2861, Department of Electronic Engineering, Hong Kong Polytechnic, Kowloon, Hong Kong and Electronics Engineering Department, Fudan University, Shanghai, P. R. China.

* cited by examiner

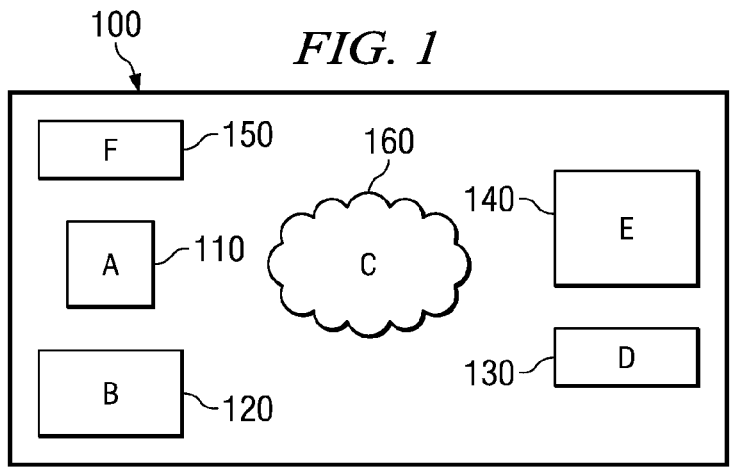
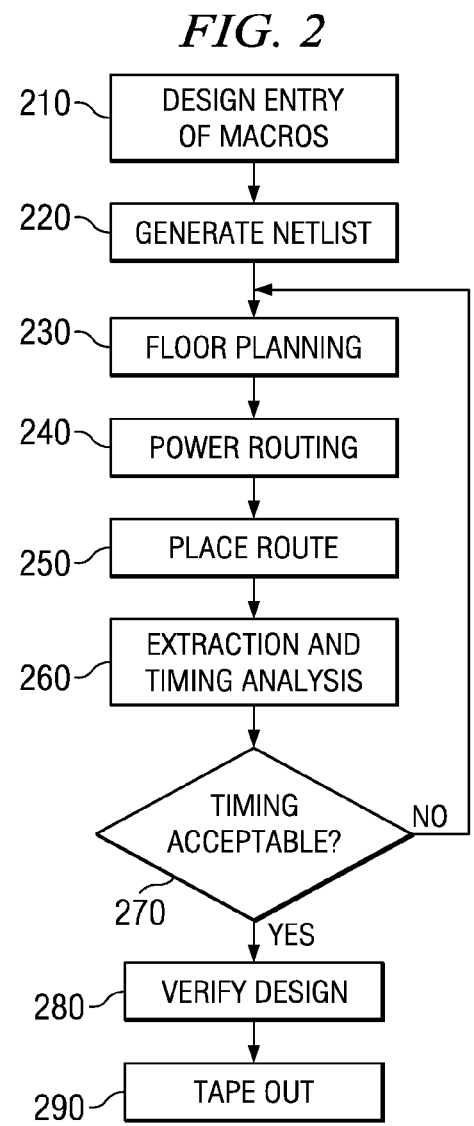

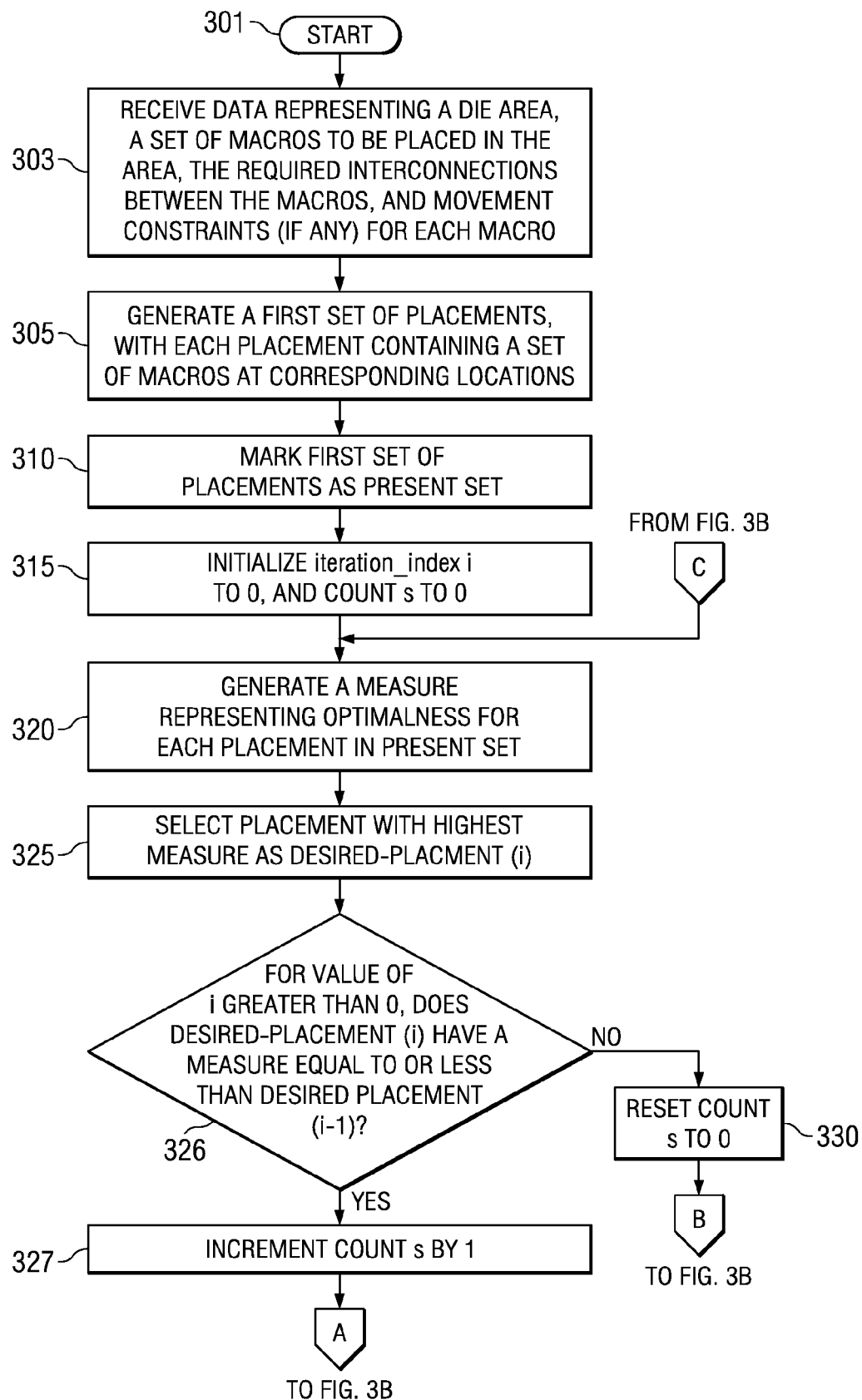

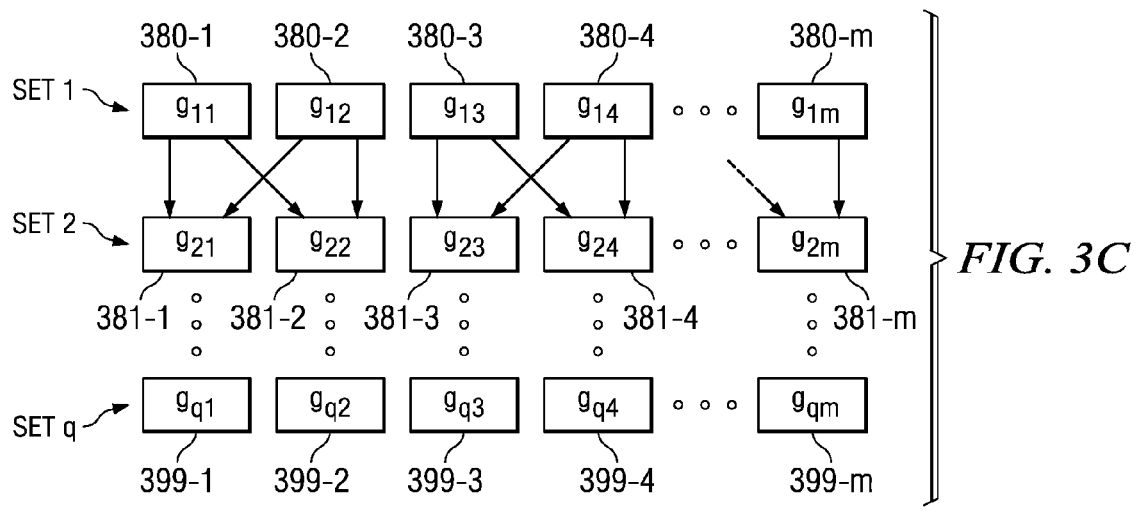
*FIG. 3C*
*FIG. 4A*
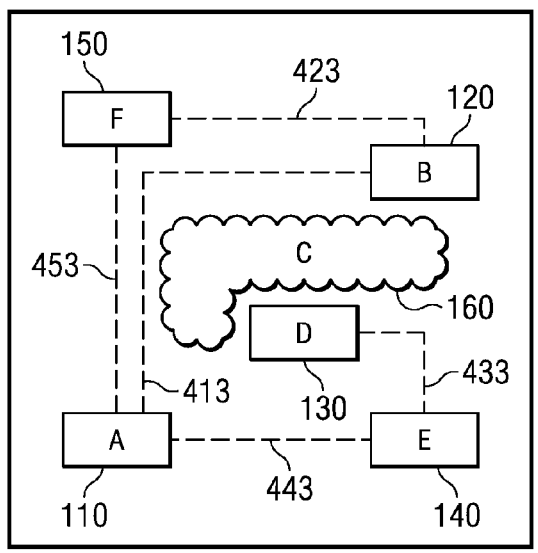
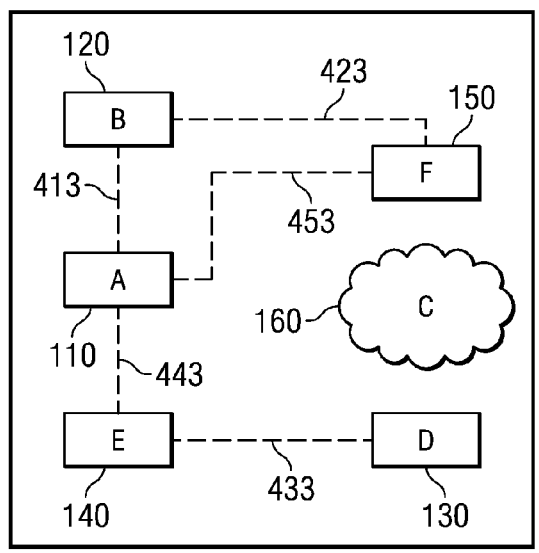
*FIG. 4B*

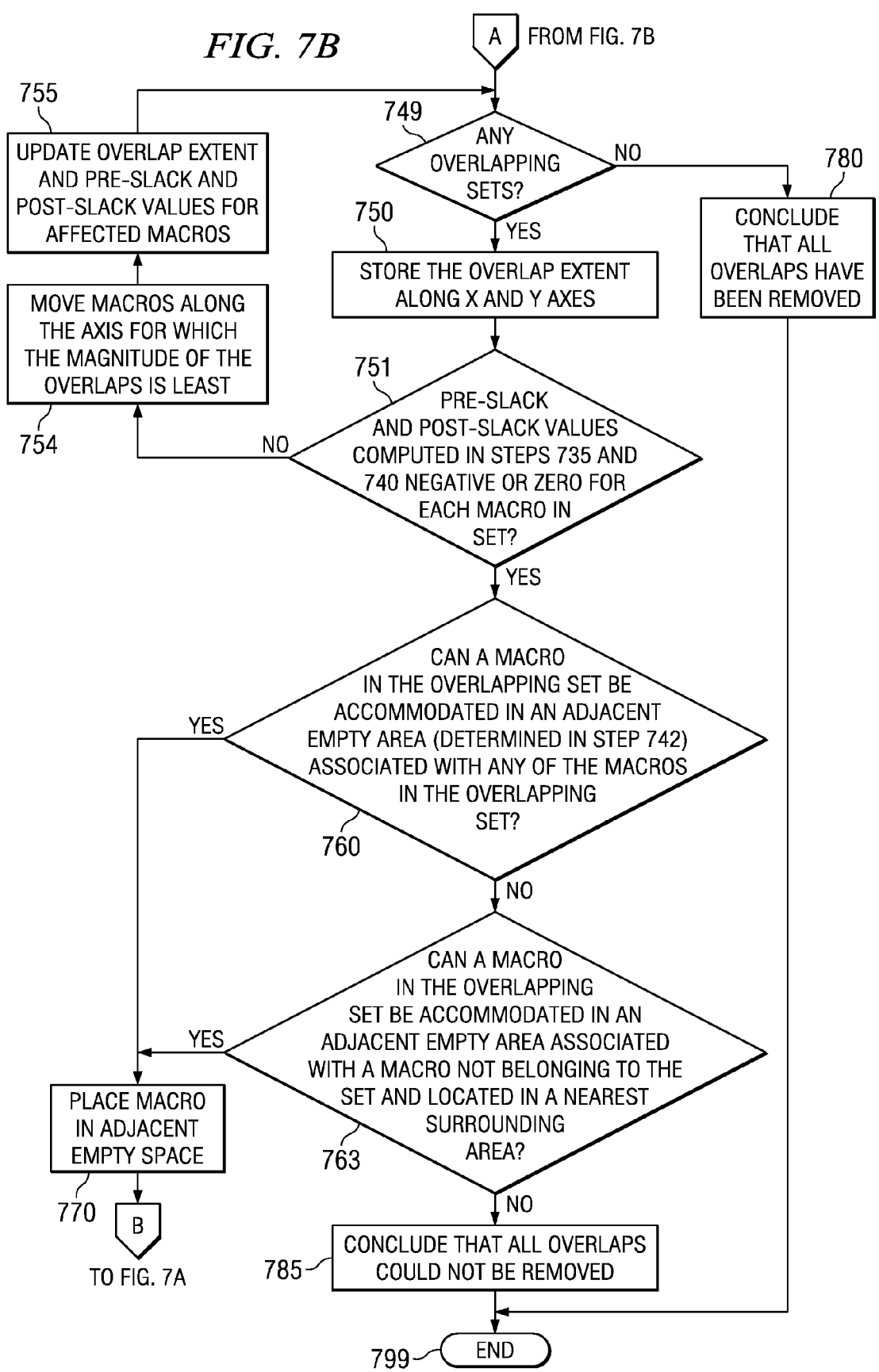

AUTOMATING OPTIMAL PLACEMENT OF MACRO-BLOCKS IN THE DESIGN OF AN INTEGRATED CIRCUIT

BACKGROUND

1. Field of the Invention

The present invention relates generally to the field of electronic design automation (EDA), and more specifically to a method for automating optimal placement of macro-blocks in the design of an integrated circuit.

2. Related Art

Integrated circuits (IC) can generally be viewed as containing several macro-blocks (hereafter "macros") and standard cells. A macro generally refers to a portion of an integrated circuit with a clearly delineated function/utility, and has corresponding input paths and output paths. Examples of such macros include processing blocks and memory blocks. A standard cell generally refers to smaller building blocks which connect the various macros with appropriate transformation (and thus also referred to as glue logic). Examples of standard cells include buffers, latches, multiplexers, etc.

Design of an IC includes several steps such as generating the circuit specifications of the design, partitioning of circuit specifications into various macros, design of individual macros, placement of macros to fit into a desired area, routing of input and output paths between the various macros, post-placement verification of the design, etc., as is well known in the relevant arts.

Thus, one of the steps in the design of an IC is the placement of the various macros. Placement generally refers to the layout (positions) of the various macros/standard cells within a given area (of semi-conductor die). Placement of macros/standard cells may be constrained by design considerations such as maximum allowable die area, power dissipation, length of inter-connected input/output paths (wire-length), etc.

Typically, an IC may contain a large number of macros and standard cells. Placement needs to be optimal at least in the sense that all the design constraints are satisfied and the time and complexity involved are minimized. One typical requirement is that the macros be placed such that there is suitable space (often contiguous and in the center of the die) for placing the standard cells. In one prior approach, placement (layout) of macros is done manually (standard cells are typically placed automatically). However, such an approach of manual macro placement may be time consuming.

Accordingly, what is required is a method of automating optimal placement of macros in the design of an integrated circuit.

BRIEF DESCRIPTION OF THE DRAWINGS

The present invention will be described with reference to the following accompanying drawings, which are described briefly below.

FIG. 1 is a block diagram illustrating the details of an integrated circuit (IC) used to describe several aspects of the present invention.

FIG. 2 is a flow chart illustrating some of the general stages involved in the design of an IC in one embodiment.

FIGS. 3A and 3B together contain a flow chart illustrating the steps involved in automated placement of macros according to an aspect of the present invention.

FIG. 3C is a diagram showing graphically the generation of new sets of placements from an earlier set of placement according to an aspect of the present invention.

FIGS. 4A, 4B and 4C are block diagrams illustrating the generation of a new placement (4C) of macros from two earlier placements (4A and 4B) of macros, according to an aspect of the present invention.

FIGS. 7A and 7B together contain a flow chart illustrating the manner in which overlap among macros in a placement may be removed accord to another aspect of the present invention.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 3B:
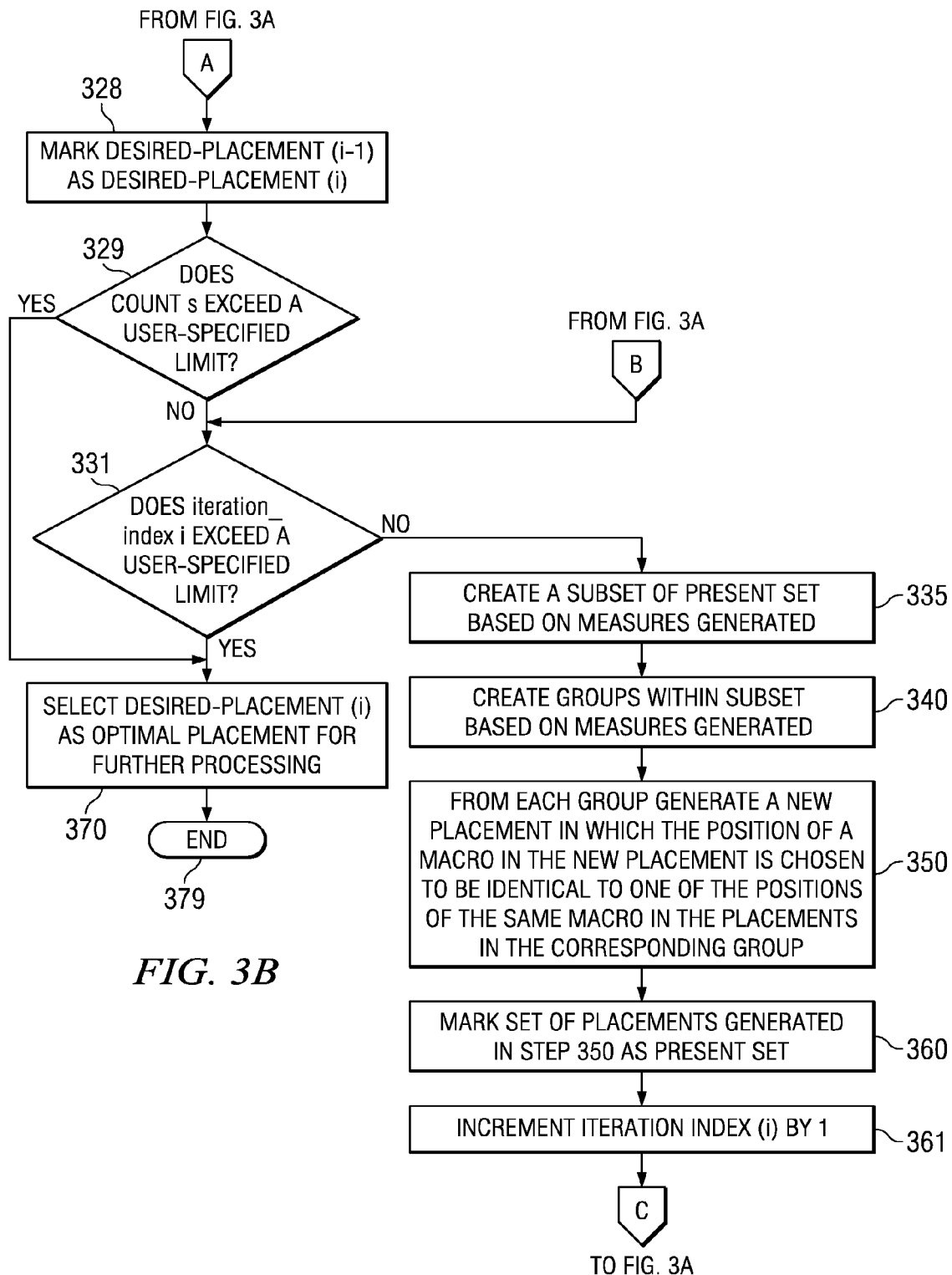

An aspect of the present invention attempts to generate a set of new placements which are more optimal from a set of present placements by setting the positions of a macro of a macro of a new placement to be identical to the position of the same macro in a specific present placement, with the specific present placement being selected from the set of present placements with a probability proportionate to the optimalness of the specific present placement. As a result, the desired features are propagated to new placements with high probability (as in genetic evolution) and placements with desired level of optimalness may be eventually obtained by iterative processing.

Another aspect of the present invention removes any overlaps of macros in a placement without requiring manual intervention. Such a feature is attained by determining the cumulative distance each macro can be moved in any of the four directions (positive and negative distances along X and Y axes) assuming that the other macros further in the path in same direction are permitted to be moved in the same direction. The specific direction to move is determined to minimize the aggregate required movement of macros to remove the overlap.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Placement Generally

FIG. 1 is a block diagram of the details of an integrated circuit (IC) used to describe several aspects of the present invention. Die 100 of the IC is shown containing blocks 110, 120, 130, 140, 150 and 160. It must be understood that the IC is shown containing only a few representative components. A typical IC may contain many of such components and associated interconnections, including but not limited to, power conditioning blocks, power routing, input/output buffering circuits, connections to external pins etc. Each block of FIG. 1 is described below in further detail.

Die 100 represents the area of a die on which the various components of the integrated circuit (including macros and standard cells) have to be placed. The interconnections between the various blocks are not shown in the figure.

Blocks A (110), B (120), D (130), E (140) and F (150) are macros that have been placed within die 100 (representing the area of the die). Macros A, B, D, E and F may represent circuits such as processing blocks, memory etc. Block C (160) represents an area in which standard cells (not shown) are placed. Standard cells may contain glue logic and simpler building blocks. There may be interconnections between macros A, B, D, E, F and standard cells within block C. Such interconnections (not shown) are used for transfer of signals between the corresponding blocks.

It should be appreciated that blocks A-E can be placed at different combination of corresponding locations, with each resulting placement providing different advantages and disadvantages. Various aspects of the present invention enable optimal placement to be attained automatically. The aspects can be appreciated by an understanding of a typical design cycle, and according the stages involved in the design of an IC are described briefly below.

3. Design of An IC

FIG. 2 is a flow chart illustrating some of the steps involved in the design of an IC. In step 210, the design entry for each block is done as per the utility/function sought to be provided by the block. Various macro blocks and standard cells are designed (or added from an existing library) using suitable design entry tools. The interconnections between various nodes in the macros/standard cells are also specified. The sizes of various macros and standard cells used in the design are obtained.

In step 220, a netlist specifying the various macros/standard cells and their interconnections is obtained from the design of step 210. In general, the design tools generate the netlist based on the design.

In step 230, the layout (placement) of the various macros/standard cells within a given area of semi-conductor die (for example, area of die 100 in FIG. 1) is done. This step (also called floor-planning) involves a determination of the placement of the various macros to satisfy design objectives/constraints such as a maximum allowable die area, power consumption etc. Such constraints may also include restrictions on placement of certain macros in certain areas of the die, physical separation (distance) between macros to prevent/minimize any potential interference in functioning etc.

This step also involves a determination of an optimal routing of the interconnections between the various macros. Such a determination may be based on minimizing area requirements and other constraints such as interference etc. This step needs to be optimal in the sense that all the design constraints are satisfied and the time and complexity involved are minimized. Merely for illustration, some requirements are noted briefly. However, various aspects of the present invention can be implemented with a different set of requirements, as will be apparent to one skilled in the relevant arts by reading the disclosure provided herein.

In step 240, routing of power to the various macros is done. This step may involve considerations such as heat dissipation of the IC, minimizing area for routing etc. In step 250, the overall circuit (design) is placed and routed based on the results of steps 230 and 240 above.

In step 260, circuit functional and timing information is extracted from the placed-and-routed design. Timing information typically specifies the time relationship between the various signals in the design.

In step 270, the timing information obtained from step 260 is analyzed. If all timing requirements are met, control passes to step 280, else control passes to step 230. In step 280, a (simulated) design verification of the circuit on a semi-conductor die (such as silicon) is done. In this step, any effects due to semi-conductor material (e.g., silicon), fabrication processes etc., are added to the simulated verification of the design. In step 290, complete design information (tapeout/database) is sent to the fabricator.

As may be appreciated from the steps above, the IC design process is often an iterative one. The sequence of steps from 230 to 270 are repeated till all design objectives are satisfied.

Step 230 (floor-planning) is often an important step once each of the building macros (such as macros A, B, D, E and F and standard cells of macro C of FIG. 1) has been designed and tested for functionality, since the number of iterations can potentially be reduced (possibly to a single pass) by starting with an optimal placement.

It may also be appreciated that step 230 may often be complicated since the number of macros that need to be placed is typically large, and the iterative procedure of manual placement and subsequent verification of the steps 230 to 270 may be complex and time consuming. Further, a manual approach may not often result in an optimal placement, given the typical time constraints in an IC design cycle.

The present invention provides an approach for automating placement of macros (step 230 above) and described below in detail.

4. Automated Placement of Macros

FIGS. 3A and 3B together contain a flow chart illustrating the steps involved in automated placement of macros according to an aspect of the present invention. Each step is described below with reference to FIG. 3C. The flowchart starts with step 301 where control immediately passes to step 303.

In step 303, data representing a die area, set of macros to be placed in the area, the required interconnections between the macros, and movement constraints (if any) for each macro is received. The macros and interconnection related information may be received in the form of a Netlist. On the other hand, a die area (similar to die 100 of FIG. 1) is generally chosen based on design requirements.

In step 305, a first set of placements is generated. Any approach, manual or automatic or a combination, can be used to generate such placements. However, in an embodiment, the location of each macro in each placement is determined randomly, using a pseudo-random number generator. For illustration, it is assumed that the placements are represented by g1 through g1m (of FIG. 3C). Control then passes to step 310.

In step 310, the first set of placements is marked to be the present set, in preparation for looped processing of steps 326-361, described below. Control then passes to step 315.

In step 315, two variables iteration_index (i) and count (s) are initialized to 0. Variable i is used to store the number of iterations of the flowchart. Variable s is used to keep a count indicating the number of iterations in which a better placement is not determined. The use of these variables will be clear with the description of the steps below. Control then passes to step 320.

In step 320, each placement in the present set is evaluated to yield corresponding measure which quantifies how optimal the placement is with respect to desired design objectives. The measure can either be a single number or possibly multiple numbers. One of several approaches well known in the relevant arts can be used to determine the measures. In an embodiment, a cost function is generated for each of the variables described below, and a single number representing the measure is then generated from the cost functions:

1. Wirelength—The associated cost function represents how minimal the wirelengths of the various interconnections are in a placement. A high value for this cost function indicates that overall wirelengths are minimized, and as such is desirable.

2. Effective standard cell placement area—The associated cost function represents how large and un-fragmented (contiguous) the area for placement of standard cells is in a placement. It may be desirable to have as large and as un-fragmented an area as possible for the placement of standard cells, and further, that most of this area be located towards the centre of the die area. A high value for this cost function indicates that effective area for standard cell placement is large, and as such is desirable.

3. Corners—The associated cost function represents how aligned macros are in a placement. It is desirable to have a placement in which the edges of macros line up as much as possible, and therefore the total number of effective corners is as low as possible. A high value for this cost function indicates that the number of effective corners is low, and as such is desirable.

The cost functions described above are computed for each placement and are combined to yield an overall measure (OM) representing optimalness of the placement. A placement is deemed to be better with correspondingly higher values of OM for illustration, in the description below. Control then passes to step 325.

In step 325, the placement (obtained from step 320) with the highest OM is marked as the desired placement for the present iteration (desired-placement (i), where i is the iteration index). Control then passes to step 326.

In step 326, the OM of the desired placement (desired-placement (i)) from the present iteration is compared with the OM of the desired placement (desired-placement (i−1)) from the previous iteration. This comparison is done only for values of i greater than 0. If the OM of desired-placement (i) is less than or equal to the OM of desired-placement (i−1), control passes to step 327, else control passes to step 330.

In step 327, the value of count s is incremented by 1. Control then passes to step 328. In step 328, desired-placement (i) is replaced by desired-placement (i−1). Control passes to step 329. Due to the operation of steps 326 and 328, in case of no improvement in a present iteration, the best placement of the previous iteration is propagated as the best placement for the present iteration.

In step 329, a comparison of count s is made with a user-specified limit. If count s exceeds the user-specified limit control passes to step 370, else control passes to step 331. Due to the operation of steps 326, 327 and 329 the number of iterations that can continue without improvement is limited by the user-specified limit.

In step 330, count s is reset to a value 0. Due to the operation of this step, if the present iteration yields an improved placement, the number of iterations that had previously yielded no improvement is reset to zero.

In step 331, the value of iteration_index i is compared with another user-specified limit. If iteration_index i exceeds the user-specified limit, control passes to step 370, else control passes to step 335. Due to the operation of step 331 and iteration index i, the total number of iterations is limited.

In step 335, a subset of placements from the present set of placements is created based on the OM of each placement. In an embodiment, the subset is created to contain half as many placements as in the present set of placements, and the probabilities of placements contained in the subset is determined by their corresponding OM. The higher the OM of a placement, the greater the probability that it will be selected to form the subset. With respect to FIG. 3C, it is assumed that g11-g13 are contained in the subset. Control then passes to step 340.

In step 340, groups containing two or more placements are created from the subset obtained from step 335. In an embodiment, each such group contains exactly two placements and the placements are again selected randomly with a probability proportionate to the corresponding computed OM. With respect to FIG. 3C, {g11 and g12} represent a group from which g21 (and also g22) is generated. Control then passes to step 350.

In step 350, new placements are created from each group created in step 340. The position of a macro in a new placement is chosen to be at least substantially identical to one of the positions of the same macro in the placements in the corresponding group. The specific present placement in the subset which controls the position of a macro in the new placement is chosen randomly. An example approach to implement this step is illustrated below with respect to FIGS. 4A-4C.

In an embodiment, each group created contains exactly two placements, and generates exactly two new placements. For example, as illustrated in FIG. 3C, group {g11,g12} generates two placements g21 and g22, and group {g13,g14} generates two placements g23 and g24. In the same embodiment, each set of new placements contains the same number of placements (In FIG. 3C, this number is represented as 'm'). Thus in FIG. 3C, set 1 representing a first set of placements g11-g1m (380-1 through 380-m) generates a new set (set 2) of placements g21-g2m (381-1 through 381-m), and set q represents the final set of placements gq1-gqm (399-1 through 399-m). Control then passes to step 360.

In step 360, the set of placements obtained from step 350 is marked to be the present set of placements. Control then passes to step 361. In step 361, the iteration index i is incremented by a value 1. Control then passes to step 320 to continue the next iteration. In step 370, the desired-placement (i) is selected as the optimal placement and is used for further processing. The flow chart ends at step 379.

It should be further appreciated that steps 335 and 340 operate to propagate the characteristics of optimal placements in a present set. However other approaches can be used to achieve similar results, while using the OM values. For example, pairs of placements can be chosen randomly, but the specific location of each macro may be determined by the placement according to the level of OM value (i.e., higher the relative OM value of a present placement, the greater the probability it will determine the location of macro in the new placement).

One problem with genetic evolution type approaches is that certain properties may become dominant to the exclusion of other desirable properties, and prevent optimal placements from being attained. Accordingly, positions of some macros may be randomly changed (for example, by moving these macros along the X and/or Y axes) in at least one placement in the new set of placements (e.g., those available at step 360). The random changes in positions may be viewed as 'mutation' in genetic evolution. The evolution may be influenced by introducing such random changes in positions of some macros. Once such changes are introduced into the present set, the processing may continue iteratively via step 361.

After a sufficient number of iterations, the approach may result in a placement that has a very high (as desired) OM, and is chosen as the optimal placement.

5. Determination of Measures Representing Optimalness And Generating A New Placement FIGS. 4A and 4B are block diagrams of two example placements containing macros A(110), B(120), D(130), E(140) and F(150). (Each of FIGS. 4A and 4B contains the same set of macros).

In each of FIGS. 4A and 4B:

413 represents the interconnections between macros A and B. 423 represents the interconnections between macros B and F. 433 represents the interconnections between macros E and D. 443 represents the interconnections between macros A and E. 453 represents the interconnections between macros A and F. Further, each of interconnections 413-453 may contain one or more signal connections. It is assumed in this example that interconnections 453, 433, 423, 413 and 443 contain (in that order) smaller number of signal connections.

As described earlier wirelength and effective standard cell placement area are two possible cost-functions that may be used to quantify optimalness of a placement.

It may be seen from FIGS. 4A and 4B that FIG. 4B has a better measure of optimalness in terms of standard cell placement area since 4B has a much larger contiguous area (block 160 (C)) for placing standard cells than 4A. Accordingly, the placement of FIG. 4B may be assigned a higher value of cost-function for this factor than 4A.

However, the placement of FIG. 4B is less optimal when compared with that of 4A in terms of wirelength. Interconnection 453 (containing the highest number of signal connections) has to travel a greater distance in 4B than in 4A. Similarly, interconnection 433 has to travel a greater distance in 4B than in 4A. Accordingly, the placement of 4A may be assigned a higher value of cost-function for this factor than 4B.

The placements of FIGS. 4A and 4B may be evaluated to yield other measures of optimalness and an overall optimalness measure (OM) may then be determined for the placements of 4A and 4B. For a given set containing several such placements, an OM is determined for each placement. Placements with higher values of OM may then be given a higher probability of being grouped to generate new placements.

Figure 4C:
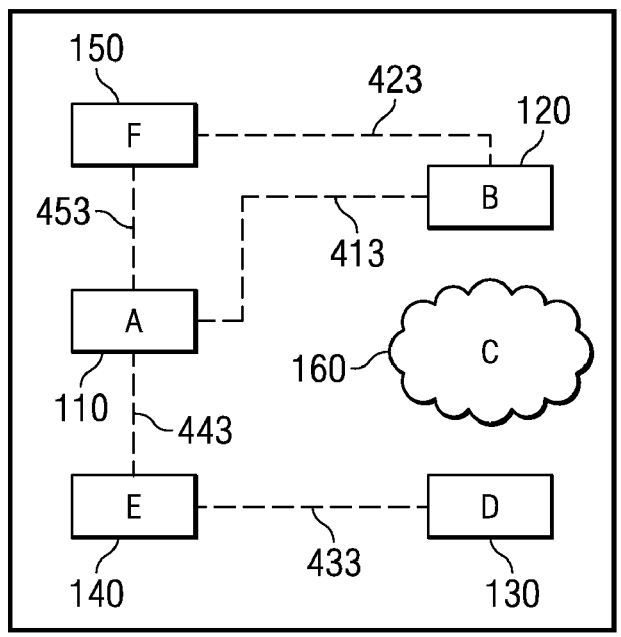

FIG. 4c is a block diagram of a new placement generated from the placements of FIGS. 4A and 4B. The diagram is shown containing macros A(110), B(120), D(130), E(140) and F(150) (the same set of macros as in FIGS. 4A and 4B). The position of each macro may be selected from either of two possible positions—position in placement of 4A or position in placement of 4B. Such a selection may be done in a random manner.

FIG. 4c shows a possible selection with the following positions:

Position of macro A is selected to be the corresponding position in FIG. 4B.

Position of macro B is selected to be the corresponding position in FIG. 4A.

Position of macro D is selected to be the corresponding position in FIG. 4B.

Position of macro E is selected to be the corresponding position in FIG. 4B.

Position of macro F is selected to be the corresponding position in FIG. 4A.

It must be understood that the new placement (and positions of macros within) of 4C is one possible outcome (based on the manner in which the selections of positions of macros is done randomly). Many other outcomes could be possible and could correspond to other placements.

Generally, new sets of placements generated in the manner described above over several iterations may yield a placement that is optimal as desired by the design engineer. The iterations are stopped when such an optimal placement is obtained. An example sequence illustrating how progressively optimal placements may be obtained using the steps described above is illustrated graphically in FIG. 5.

6. Optimal Placement Obtained After Several Iterations

Figure 5:
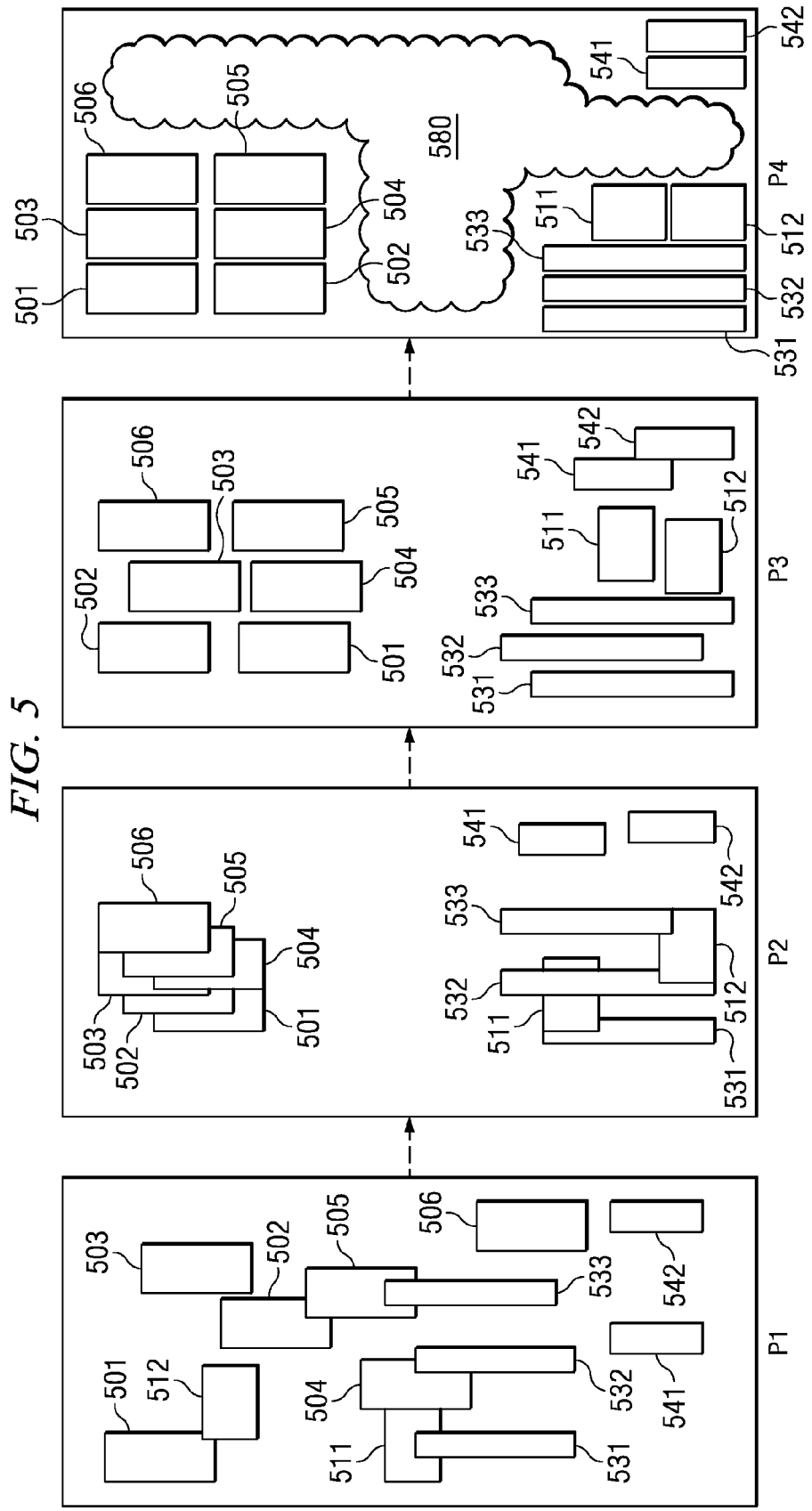
FIG. 5 is a diagram of example placements that may be obtained at various stages of iterations according to some aspects of the present invention.

FIG. 5 is a diagram of example placements that may be obtained at various stages of iteration using the procedure described earlier. The diagram is shown containing 4 example placements P1-P4. Each of placements P1-P4 contain macros 501-506, 511-512, 531-533 and 541-542. Each placement P1 through P4 is described briefly below.

Placement P1 may be contained in the set of first placements generated using the procedures described earlier, and may correspond to, for example, $g_{11}$ of FIG. 3C. Similarly P2 may correspond to $g_{23}$ and P4 may correspond to $g_{q1}$.

It may be seen that the placements (P1-P4) are progressively more optimal in terms of the positions of macros. For instance, visual inspection of P4 shows that some of the example measures (associated with variables such as wirelength, effective area for placement of standard cells and corners) have been maximized. Thus, P4 may represent an optimal placement as desired by an IC designer.

One problem with the above-described approach is that the generated placements may contain macros which overlap spatially. The corresponding placement is unacceptable as an optimal placement.

Accordingly, in one prior approach, a design tool implemented in software enables a user to manually move the macros and the user may user his/her judgement to move the macros and remove the overlaps. However, such manual intervention may not be desirable at least in that it might consume unacceptable high amount of time. At least for such a reason, it may be desirable to provide an approach by which the macros are automatically moved to eliminate the overlap.

In addition, with respect to the approach of FIGS. 3A and 3B, it may be desirable to first remove the overlaps from the macros before proceeding with step 320, so as to expedite attaining the optimal placement. An aspect of the present invention facilitates such removal described in sections below. First, the overlap is illustrated in an example scenario.

Figure 6:
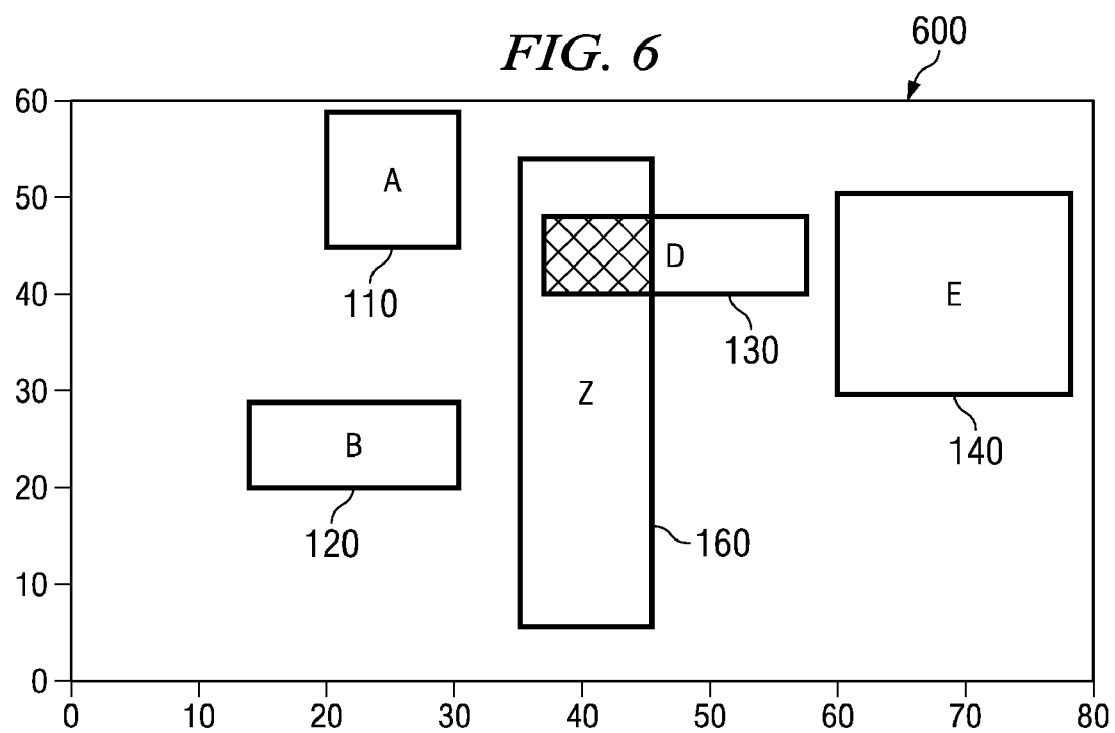
FIG. 6 is a block diagram of an example placement illustrating overlap between macros.

FIG. 6 is a block diagram of an example placement illustrating overlap between macros. Die area 600 is shown containing macros A(110), B(120), D(130), E(140) and Z(610). It maybe seen that there is an overlap (shaded area in FIG. 6) between macro Z and macro D. Such an overlap may be removed by the approaches described below.

7. Overlap Removal

Figure 7A:
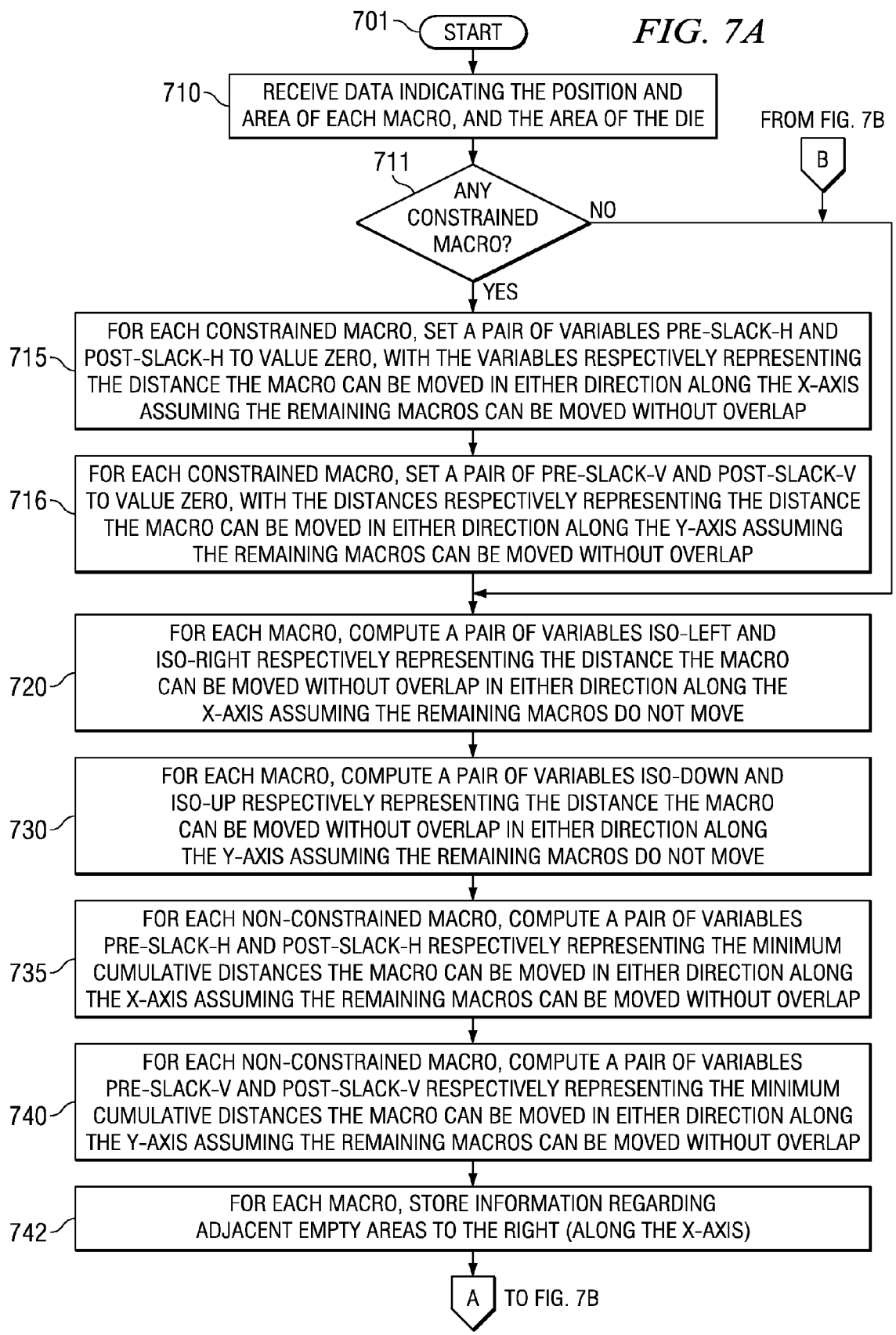

FIGS. 7A and 7B together contain a flow chart illustrating the manner in which overlap among macros may be removed according to an aspect of the present invention. The flowchart is described below with respect to FIGS. 8A, 8B, 9A and 9B, with each of these Figures containing the same set of macros.

Figure 8A:
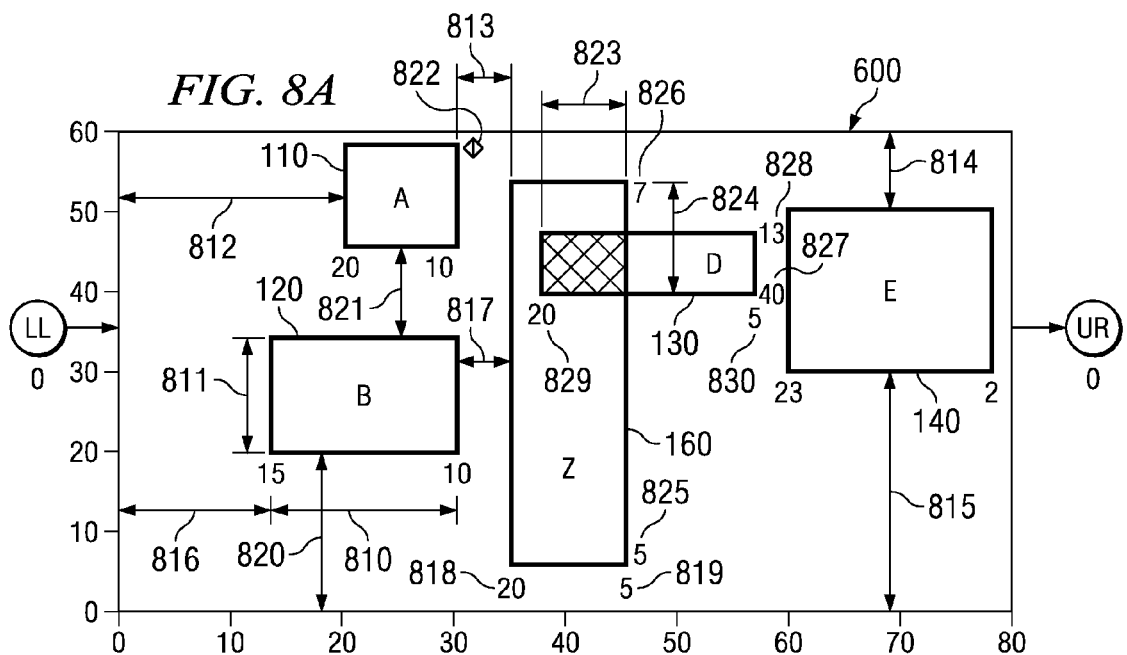
FIG. 8A is a block diagram of a placement containing overlapping macros where all macros are free to move (unconstrained).
Figure 8B:
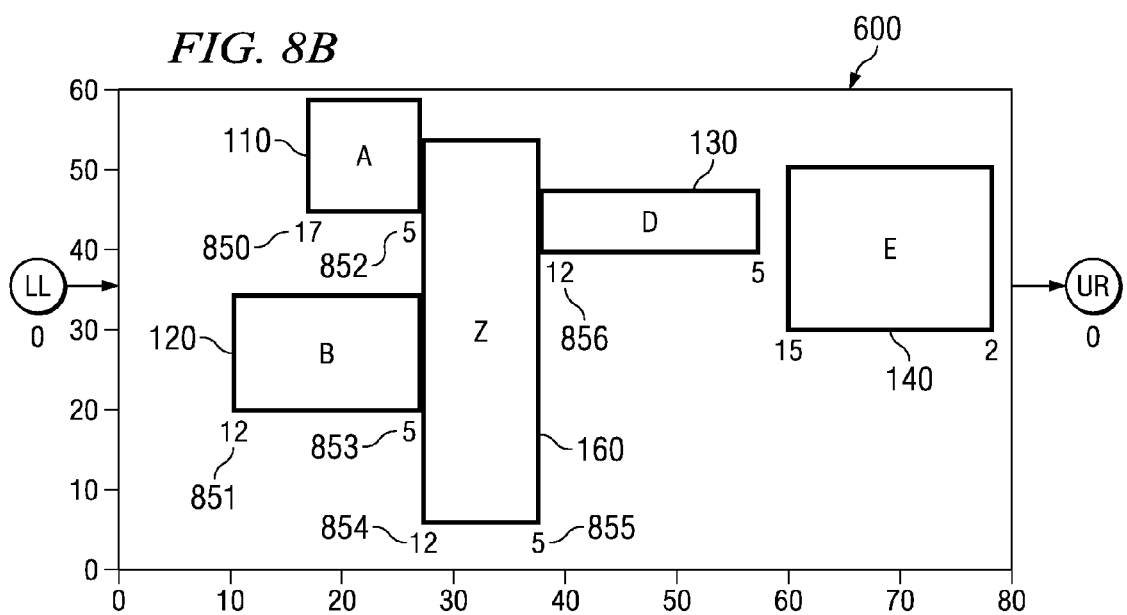
FIG. 8B is a block diagram of the placement of 8A with the overlap having been removed by using the approaches according some aspects of the present invention.
Figure 9A:
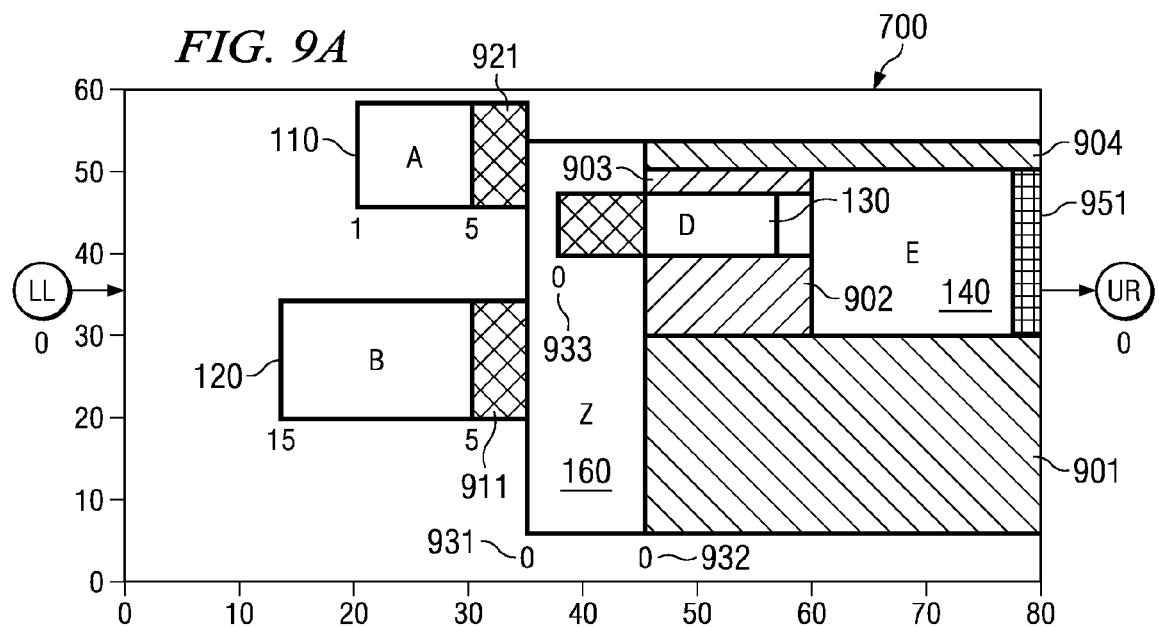
FIG. 9A is a block diagram of a placement containing overlapping macros where all macros are not free to move (constrained).
Figure 9B:
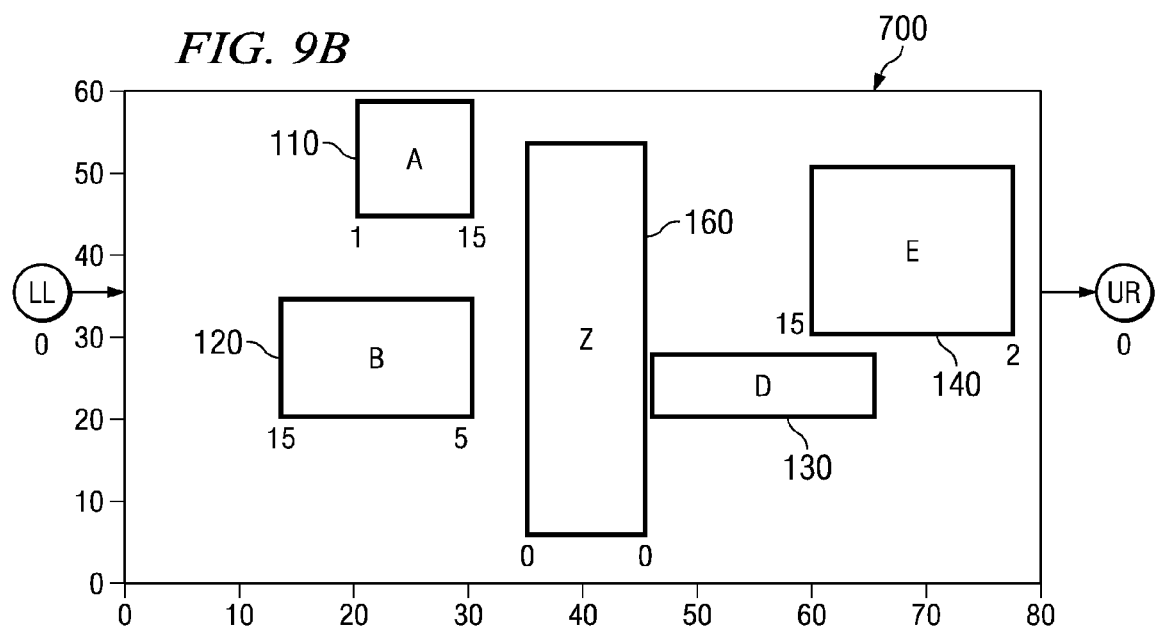
FIG. 9B is a block diagram of the placement of 9A with the overlap having been removed by using the approaches according to an aspect of the present invention.

The distances in FIGS. 8A, 8B, 9A and 9B are not to scale, but the X-axis and Y-axis are marked with units to appreciate the operation of various features described below. All macros in FIGS. 8A and 8B are free to move within die area 600 and thus are said to be unconstrained. In FIGS. 9A and 9B showing die area 700, macro Z is not free to move and is constrained. The left-edge LL and right edge UR of the die area are considered to be constrained in each of FIGS. 8A, 8B, 9A and 9B. The flow chart starts in step 701, in which control passes to step 710.

In step 710, data indicating the position and area of each macro in the design that is to be placed, as well as the area of the die is received. For illustration, the received data may indicate that die area 600 of FIG. 8A has an area of 60×80 square units, macro B is placed with lower-left corner at co-ordinates (10,20) and has a width of 15 units (810) and height of 15 units (811).

In step 711, it is determined whether there are any constrained macros (macros that must be placed in a position indicated by received data and should not be moved). Control passes to step 715 in case there are constrained macros, else control passes to step 720. For illustration, it is assumed that macro Z of FIGS. 9A and 9B is a constrained macro.

In step 715, for each constrained macro, a pair of variables pre-slack-h and post-slack-h are set to zero. Variable pre-slack-h represents a distance the macro can be moved in the negative (leftward) direction along the X-axis, assuming the remaining macros (in the leftward direction) can be moved without causing overlaps. Similarly, post-slack-h represents a distance the macro can be moved in the positive (rightward) direction along the X-axis, assuming the remaining macros can be moved without causing overlaps. A constrained macro must not be moved and hence both variables are set to zero. For example, with respect to FIG. 9A, macro Z must not be moved and hence pre-slack-h (931) and post-slack-h (932) values for macro Z are set to zero. Control passes to step 716.

In step 716, for each constrained macro, a pair of variables pre-slack-v and post-slack-v are set to zero. Variable pre-slack-v represents a distance the macro can be moved in the negative (downward) direction along the Y-axis (orthogonal/ 90 degrees to X-axis), assuming the remaining macros (below) can be moved without causing overlaps. Similarly, post-slack-v represents a distance the macro can be moved in the positive (upward) direction along the Y-axis, assuming the remaining macros can be moved without causing overlaps. Control passes to step 720.

In step 720, the distance by which each macro can be moved to the left (iso-left, convenient abbreviation for isolated left) direction and right (iso-right) direction along the X-axis (and with respect to the corresponding edges of the die area) without causing overlaps and going off the die area is computed. In computing such distances, it is assumed that remaining macros do not move.

For example, with respect to FIG. 8A, 812 (iso-left value of 20 units) and 813 (iso-right value of 5 units) are the distances by which macro A may be moved to the left and right respectively along the X-axis, with all other macros not being moved. Control passes to step 730.

In step 730, the distance by which each macro can be moved upwards (iso-up) and downwards (iso-down) along the Y-axis (and with respect to the corresponding edges of the die area) without causing overlaps and going off the die area is computed. In computing such distances it is assumed that remaining macros do not move.

For example, with respect to FIG. 8A, 813 (iso-up value of 10 units) and 814 (iso-down value of 30 units) are the distances by which macro E may be moved upwards and downwards respectively along the Y-axis, with all other macros not being moved. Control passes to step 735.

In step 735, the minimum (cumulative) distance by which each macro can be moved to the left (pre-slack-h) and right (post-slack-h) along the X-axis is computed. In computing such distances it is assumed that remaining macros can be moved without causing overlaps.

Pre-slack for a macro along the X-axis is computed in the following manner:

Pre-slack of LL (left edge of die area) is zero.

$$\text{Pre-slack-}h(v_j)=\min[\text{pre-slack-}h(v_i)+e_{ij}] \qquad \text{Equation 1.}$$

wherein:

$v_j$ is the macro for which pre-slack is to be computed.

$v_i$ represents all macros (for various values of i) located to the left of macro $v_j$ and which are located in the path along the X-axis of macro $v_j$ $e_{ij}$ is the separation (distance) between $v_j$ and a macro $v_i$ min[ ] represents the "minimum" mathematical function.

As an example, in FIG. 8A, macro A may be moved 20 units (812) to the left, and B may be moved 15 units (816) to the left without overlap. Assuming macro B were not present, macro Z may be moved 25 units to the left, 20 units (812) obtained by moving macro A leftwards and the remaining 5 units (813) representing the separation between A and Z. Thus, the value of (pre-slack A+$e_{az}$) is 25.

Similarly, assuming macro A were not present, macro Z may be moved 20 units to the left, 15 units (816) obtained by moving macro B leftwards and the remaining 5 units (817) representing the separation between B and Z. Thus, the value of (pre-slack B+$e_{bz}$) is 20. Pre-slack of macro Z is thus the minimum of (pre-slack A+$e_{az}$) and (pre-slack B+$e_{bz}$) which is equal to 20. A value of 20 representing the pre-slack of Z is accordingly shown at the bottom left (818) of block Z in FIG. 8A. Pre-slack-h for other macros are indicated at the lower-left corner of the corresponding macro.

Post-slack for a macro in the horizontal direction is computed in the following manner:

Post-slack of UR is zero.

$$\text{Post-slack-}h(v_j)=\min[\text{post-slack-}h(v_i)+f_{ij}] \qquad \text{Equation 2}$$

wherein:

$v_j$ is the macro for which post-slack is to be computed.

$v_i$ represents all macros (for all values of i) located to the right of $v_j$ and which are located in the path along the X-axis of macro $v_j$ $f_{ij}$ is the separation between $v_j$ and a macro $v_i$ min[ ] represents the "minimum" mathematical function.

Post-slack-h for each macro in FIG. 8A is indicated at the lower-right corner of the corresponding macro. For example, 819 (value of 5) is the post-slack-h of macro Z. Control passes to step 740.

In step 740, the minimum (cumulative) distance by which each macro can be moved downwards (pre-slack-v) and upwards (post-slack-v) along the Y-axis is computed. In computing such distances it is assumed that remaining macros can be moved without causing overlaps.

Pre-slack for a macro in the vertical direction is computed in the following manner:

Pre-slack of LL is zero.

$$\text{Pre-slack-}v(v_j)=\min[\text{pre-slack-}v(v_i)+g_{ij}] \qquad \text{Equation 3.}$$

wherein:

$v_j$ is the macro for which pre-slack is to be computed.

$v_i$ represents all macros (for all values of i) located below $v_j$ and which are located in the path along the Y-axis of macro $v_j$ $g_{ij}$ is the separation between $v_j$ and a macro $v_i$ min[ ] represents the "minimum" mathematical function.

Post-slack for a macro in the vertical direction is computed in the following manner:

Post-slack of UR is zero.

$$\text{Post-slack-}v(v_j)=\min[\text{post-slack-}v(v_i)+h_{ij}] \quad \text{Equation 4.}$$

wherein:

$v_j$ is the macro for which post-slack is to be computed.

$v_i$ represents all macros (for all values of i) located above $v_j$ and which are located in the path along the Y-axis of macro $v_j$ $H_{ij}$ is the separation between $v_j$ and a macro $v_i$.

min[ ] represents the "minimum" mathematical function.

As an example, with respect to FIG. 8A, macro B can be moved 20 units (pre-slack-v 820) downwards, and 12 units (821 plus 822) upwards (post-slack-v) along the Y-axis. Control then passes to step 742.

In step 742, information representing empty adjacent areas to the right (along the X-axis) of each macro is also stored. Assuming each macro is a rectangle, the rectangles contained in areas to the right which are contiguous with the present position of the macro are treated as adjacent areas. As an illustration, with respect to FIG. 9A, shaded area 901-904 are empty areas adjacent (and to the right of) to macro Z. Thus, information regarding shaded areas 901-904 (such as co-ordinates of corners of areas 901-904) are stored for later use. Control passes to step 749.

In step 749, it is checked whether there are any overlapping macros. This may be done by checking whether any of the distances (iso-left, iso-right, iso-up and iso-down computed in steps 720 and 730) associated with macros have negative values. A negative value indicates that there is an overlap. The corresponding set of macros is then marked as an overlapping set to be processed further in step 750. If an overlapping set(s) is found, control passes to step 750, else to step 780.

As an example, with respect to FIG. 8A, macro Z has an iso-right (823) value of −8 and macro D has an iso-left (823) value of −8, indicating that there is an overlap of 8 units between Z and D. Accordingly, for the example of FIG. 8A control would pass to step 750.

In the description below, for simplicity of understanding and description, it is assumed that only one overlap set is present (as shown in FIG. 8A).

In step 750, the extent of overlap along X and Y axis for a set of overlapping macros is stored for further processing. For example, with respect to FIG. 8A, a set containing macro Z and macro D along with the corresponding value of 823 (overlap along X-axis) and 824 (overlap along Y-axis) are stored. Control passes to step 751.

In step 751, for each macro in an overlapping set, the pre-slack and post-slack values (computed in steps 735 and 740) are checked to determine whether each of the values is less than the extent of overlap. In case the checked condition is true, overlap cannot be removed by moving macros along the X-axis and/or Y-axis, and an alternative technique (of steps 760-770) is required. In case the checked condition is not true, the set and control are passed to step 754.

For example, from FIG. 8A, macro Z has a value of pre-slack-h (818) which is greater than the extent of overlap (823). Macro D also has a of pre-slack-h (829) which is greater than the extent of overlap (823). Therefore, control would pass to step 754 in case of processing of the placement of FIG. 8A. In contrast, macro Z and macro D of FIG. 9A have pre-slack-h values (931 and 933 respectively) of zero. Therefore, control would pass to step 760 in case of processing of placement of FIG. 9A.

In step 754, macros in the received set are moved along the axis along which overlap is minimum. Thus, the aggregate movement required along each axis may be computed, and a decision may be made to move along the axis requiring lesser aggregate movement. The aggregate movement in each direction may be determined by assuming one of the overlapping macros to be fixed, and determining how much each macro needs to be moved to remove the overlap.

As an example, from FIG. 8A, macro Z and macro D have an overlap of 8 units (823) along the X-axis and 13 units (824) along the Y-axis. Since the overlap is less along the X-axis, macros are moved along the X-axis to remove overlap. With respect to FIG. 8A, overlap between Z and D may be removed by moving macros A and B 3 units to the left (along the X-axis) and moving macro Z 8 units to the left (along the X-axis). FIG. 8B shows the placement with the overlap removed. Control then passes to step 755.

In step 755, overlap extent (determined in step 750) and pre-slack and post-slack values that might have changed for macros due to the operation of step 754 are updated. Control is then passed back to step 749 where it is again determined whether there are any overlaps.

As an example, with respect to FIGS. 8A and 8B, the step of 754 caused macros A, B and Z to be moved to the left. Therefore pre-slack and post-slack values are updated and are shown in FIG. 8B (851-856).

In step 780, it is concluded that all overlaps have been removed. Control goes to step 799 where the flowchart ends.

In step 785, it is concluded that all overlaps could not be removed. Control goes to step 799 where the flowchart ends.

In step 760, it is determined whether a macro in the received set of overlapping macros can be accommodated in an adjacent empty area associated with any of the macros in the overlapping set. (Information regarding adjacent empty spaces for each macro was stored in step 742). If an empty area is determined to be present control passes to step 770, else control passes to step 763.

As an example, with respect FIG. 9A, step 742 stores information representing empty areas 901-904 associated with macro Z. It is determined that area 901 is large enough to accommodate macro D. Accordingly control would pass to step 770.

In step 763, it is determined whether a macro in the received set of overlapping macros can be accommodated in an adjacent empty area associated with a macro not belonging to the overlapping set and located in a nearest surrounding area. If an empty area is determined to be present, control passes to step 770. Absence of empty areas may indicate congestion in the placement which may be removed by processing other overlapping sets and moving associated macros, and control then passes to step 749, where processing of a next overlapping set may begin.

For illustration, with respect to FIG. 9A, macros A, B and E do not belong to the overlapping set containing Z and D and are located in a nearest surrounding area (with respect to the overlapping macros Z and D). Assuming empty area 901 had not been present, it would be checked to determine whether macro D may be accommodated in areas 921, 911 and 951 (adjacent empty areas, shown as shaded areas with crossed/hatched lines, associated with macros A, B and E respectively).

In step 770, the macro is shifted to the empty space determined in steps 760 or 763. Control then passes to step 720 where the various variables representing distances are updated. As an example, with respect to FIG. 9A, D may be shifted to area 901. In this example, the shift removes the overlap between macros Z and D. The overlap-free placement of die 700 is shown in FIG. 9B.

The various steps described above are repeated till it is determined either that all overlaps have been removed or that some overlaps remain that cannot be removed. In the latter case, the design engineer may consider increasing the die area and repeating the above described overlap- removal approach. It should be appreciated that the approach(es) described above enable the overlap to be removed without manual intervention.

The flowcharts and approach described above can be implemented in a combination of one or more of hardware, software and firmware, as will be apparent to one skilled in the relevant arts by reading the disclosure provided herein. The description is continued with respect to an embodiment in which the features are operative upon execution of software instructions.

8. Software Implementation

Figure 10:
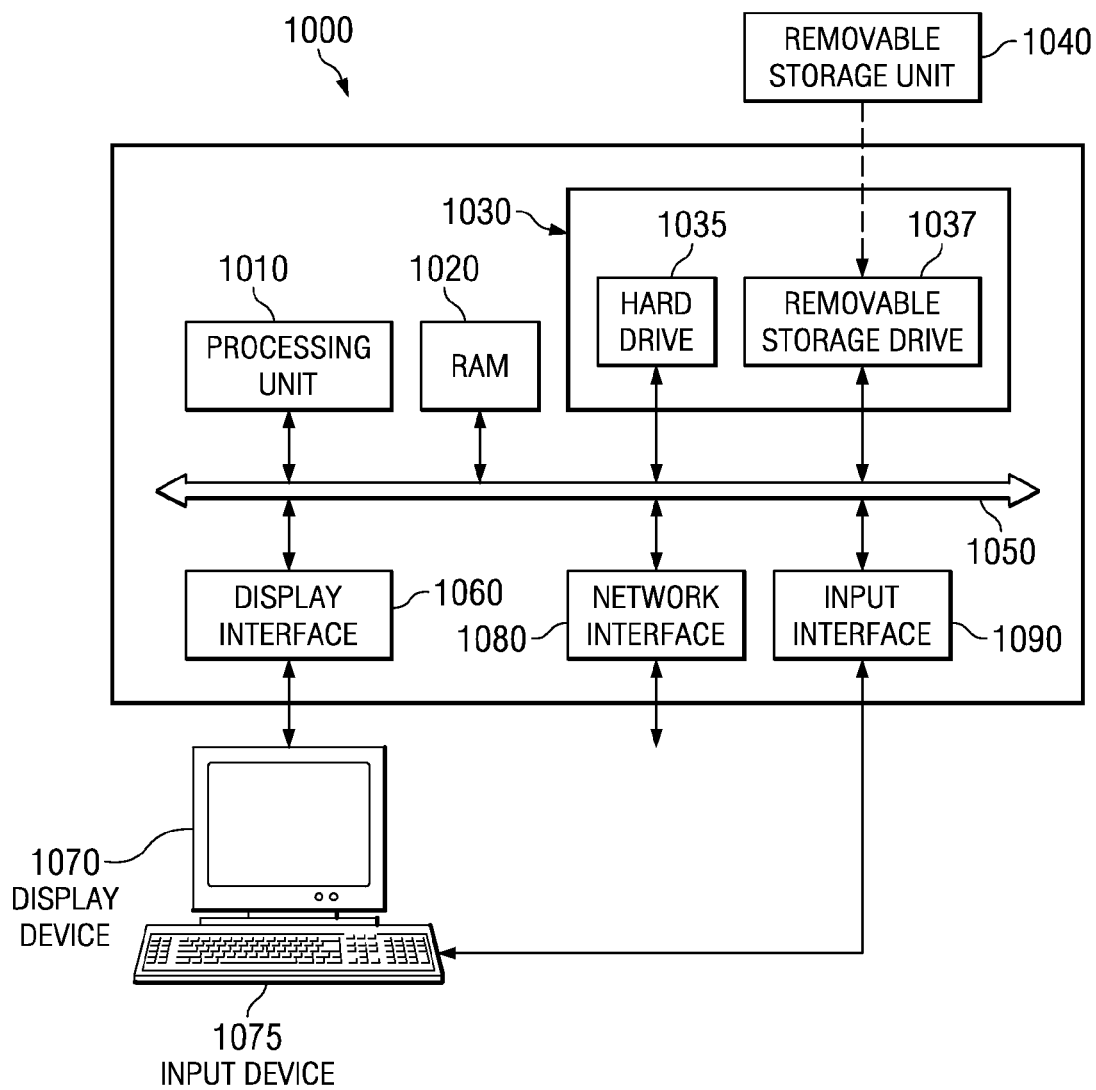
FIG. 10 is a block diagram illustrating the details of an embodiment of a system substantially in the form of software according to an aspect of the present invention.

FIG. 10 is a block diagram illustrating the details of an embodiment in which the approaches described in above sections may be implemented. Workstation 1000 is shown containing processing unit 1010, random access memory (RAM) 1020, storage 1030, display interface 1060, network interface 1080, input interface 1090, display device 1070 and input device 1075. Each component is described in further detail below.

Display interface 1060 provides output signals (e.g., display signals to display device 1070, such as a CRT monitor) which can form the basis for a suitable user interface. Input interface 1090 (e.g., interface with input device 1075 such as key-board and/or mouse) enables a user to provide any necessary inputs to edge router 120. Display interface 1060 and input interface 1090 can be used, for example, to enable an engineer to select a design for placement and executing commands to run software for optimal placement of macros (as described above).

RAM 1030 and storage 1030 may together be referred to as a memory. RAM 1030 receives instructions and data on path 1050 from storage 1030. Secondary memory 1030 may contain units such as hard drive 1035 and removable storage drive 1037. Secondary storage 1030 may store the software instructions and data (e.g., Netlist), which enable workstation 1000 to provide several features in accordance with the present invention.

Some or all of the data and instructions may be provided on removable storage unit 1040, and the data and instructions may be read and provided by removable storage drive 1037 to processing unit 1010. Floppy drive, magnetic tape drive, CD_ROM drive, DVD Drive, Flash memory, removable memory chip (PCMCIA Card, EPROM) are examples of such removable storage drive 1037.

Processing unit 1010 may contain one or more processors. Some of the processors can be general purpose processors which execute instructions provided from RAM 1020. Some can be special purpose processors adapted for specific tasks (e.g., for memory/queue management). The special purpose processors may also be provided instructions from RAM 1020. In general processing unit 1010 reads sequences of instructions from various types of memory medium (including RAM 1020, storage 1030 and removable storage unit 1040), and executes the instructions to provide various features of the present invention.

Network interface 1080 enables workstation 1000 to send and receive data on communication networks. Network interface 1080, display interface 1060 and input interface 1090 can be implemented in a known way. Embodiments according to FIG. 10 can be used for automating optimal placement of macro-blocks in the design of an integrated circuit as described in sections above.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of placing a set of macros in an area representing a die of an integrated circuit, said method being performed in a digital processing system, said method comprising:

receiving a set of present placements, wherein each of said set of present placements indicates a corresponding present location where each of said set of macros is placed in said area;

computing a set of present measures wherein each of said set of present measures represents an optimalness of corresponding placement;

forming a set of new placements, wherein each of said set of new placements is formed from a corresponding plurality of present placements, wherein said corresponding plurality of present placements are comprised in said set of present placements, wherein a first new placement contained in said set of new placements is formed from a first present placement and a second present placement, wherein a first subset of macros in said first new placement are placed in identical locations as specified by said first present placement and a second subset of macros are placed in identical locations as specified by said second present placement, wherein said first subset of macros and said second subset of macros are contained in said set of macros;

locating a fifth placement in one of said set of present placements, said fifth placement having a plurality of overlapping macros which overlap, wherein said plurality of overlapping macros are contained in said plurality of macros, determining a new location for at least one of said plurality of overlapping macros; and shifting said one of said plurality of overlapping macros to said new location, wherein said locating, determining and said shifting are performed computationally without requiring human intervention;

wherein said determining comprises:

computing a first cumulative distance and a second cumulative distance along a first axis and a third cumulative distance and a fourth cumulative distance along a second axis for each macro in said fifth placement, wherein said first axis and said second axis are orthogonal to each other, said first cumulative distance represents a minimum distance a macro in said fifth placement can be moved in a direction along said first axis assuming other macros can be moved without overlap;

said second cumulative distance represents a minimum distance a macro in said fifth placement can be moved in an opposite direction along said first axis assuming other macros can be moved without overlap;

said third cumulative distance represents a minimum distance a macro in said fifth placement can be moved in a direction along said second axis assuming other macros can be moved without overlap; and said fourth cumulative distance represents a minimum distance a macro in said fifth placement can be moved in an opposite direction along said second axis assuming other macros can be moved without overlap.

2. The method of claim 1, wherein said determining further comprising:

computing a first isolated distance and a second isolated distance along said first axis and a third isolated distance and a fourth isolated distance along said second axis for each macro in said fifth placement, wherein:

said first isolated distance represents a distance a macro in said fifth placement can be moved in a direction along said first axis assuming other macros do not move;

said second isolated distance represents a distance a macro in said fifth placement can be moved in an opposite direction along said first axis assuming other macros do not move;

said third isolated distance represents a distance a macro in said fifth placement can be moved in a direction along said second axis assuming other macros do not move; and said fourth isolated distance represents a distance a macro in said fifth placement can be moved in an opposite direction along said second axis assuming other macros do not move, wherein said first cumulative distance, said second cumulative distance, said third cumulative distance and said fourth cumulative distance are respectively computed from said first isolated distance, said second isolated distance, said third isolated distance and said fourth isolated distance.

3. The method of claim 1, wherein said determining further comprises identifying an empty area adjacent to each macro in said fifth placement and storing a corresponding information.

4. The method of claim 3, wherein said determining further comprises identifying for each macro in said fifth placement a negative value for any of said first isolated distance, said second isolated distance, said third isolated distance or said fourth isolated distance, said identifying yielding a set of overlapping macros, said negative value representing an extent of overlap along said first axis or said second axis.

5. The method of claim 4, wherein said shifting comprises identifying a macro in said set of overlapping macros as a candidate for shifting if at least one positive value greater than said extent of overlap for any of said first cumulative distance, said second cumulative distance, said third cumulative distance or said fourth cumulative distance associated with said macro is identified, wherein said shifting is done along said first axis if said extent of overlap is lesser along said first axis than said second axis, and along said second axis if said extent of overlap is lesser along said second axis than said first axis.

6. The method of claim 5, wherein said shifting further comprising identifying a macro in said set of overlapping macros as a candidate for said shifting if a value less than said extent of overlap is present for each of said first cumulative distance, said second cumulative distance, said third cumulative distance or said fourth cumulative distance associated with said macro, wherein said shifting is performed to a first empty area determined to be present adjacent to any macro in said set of overlapping macros, and said shifting is done to a second empty area adjacent to a macro not comprising said set of overlapping macros, if said first empty area is determined not to be present.

7. The method of claim 6, wherein at least one macro not comprised in said one of said plurality of overlapping macros is not allowed to move.

8. The method of claim 1, wherein said determining and said shifting are repeated until overlaps are removed from said fifth placement.

9. A computer readable medium carrying one or more sequences of instructions for causing a system to place a set of macros in an area representing a die of an integrated circuit, wherein execution of said one or more sequences of instructions by one or more processors contained in said system causes said one or more processors to perform the actions of:

receiving a set of present placements, wherein each of said set of present placements indicates a corresponding present location where each of said set of macros is placed in said area;

computing a set of present measures wherein each of said set of present measures represents an optimalness of corresponding placement;

forming a set of new placements, wherein each of said set of new placements is formed from a corresponding plurality of present placements, wherein said corresponding plurality of present placements are comprised in said set of present placements, wherein a first new placement contained in said set of new placements is formed from a first present placement and a second present placement, wherein a first subset of macros in said first new placement are placed in identical locations as specified by said first present placement and a second subset of macros are placed in identical locations as specified by said second present placement, wherein said first subset of macros and said second subset of macros are contained in said set of macros;

locating a fifth placement in one of said set of present placements, said fifth placement having a plurality of overlapping macros which overlap, wherein said plurality of overlapping macros are contained in said plurality of macros, determining a new location for at least one of said plurality of overlapping macros; and shifting said one of said plurality of overlapping macros to said new location, wherein said locating, determining and said shifting are performed computationally without requiring human intervention;

wherein said determining comprises:

computing a first cumulative distance and a second cumulative distance along a first axis and a third cumulative distance and a fourth cumulative distance along a second axis for each macro in said fifth placement, wherein said first axis and said second axis are orthogonal to each other, said first cumulative distance represents a minimum distance a macro in said fifth placement can be moved in a direction along said first axis assuming other macros can be moved without overlap;

said second cumulative distance represents a minimum distance a macro in said fifth placement can be moved in an opposite direction along said first axis assuming other macros can be moved without overlap;

said third cumulative distance represents a minimum distance a macro in said fifth placement can be moved in a direction along said second axis assuming other macros can be moved without overlap; and said fourth cumulative distance represents a minimum distance a macro in said fifth placement can be moved in an opposite direction along said second axis assuming other macros can be moved without overlap.

10. The computer readable medium of claim 9, wherein said determining further comprising:

computing a first isolated distance and a second isolated distance along said first axis and a third isolated distance and a fourth isolated distance along said second axis for each macro in said fifth placement, wherein:

said first isolated distance represents a distance a macro in said fifth placement can be moved in a direction along said first axis assuming other macros do not move;

said second isolated distance represents a distance a macro in said fifth placement can be moved in an opposite direction along said first axis assuming other macros do not move;

said third isolated distance represents a distance a macro in said fifth placement can be moved in a direction along said second axis assuming other macros do not move; and said fourth isolated distance represents a distance a macro in said fifth placement can be moved in an opposite direction along said second axis assuming other macros do not move, wherein said first cumulative distance, said second cumulative distance, said third cumulative distance and said fourth cumulative distance are respectively computed from said first isolated distance, said second isolated distance, said third isolated distance and said fourth isolated distance.

11. The computer readable medium of claim 9, wherein said determining further comprises identifying an empty area adjacent to each macro in said fifth placement and storing a corresponding information.

12. The computer readable medium of claim 11, wherein said determining further comprises identifying for each macro in said fifth placement a negative value for any of said first isolated distance, said second isolated distance, said third isolated distance or said fourth isolated distance, said identifying yielding a set of overlapping macros, said negative value representing an extent of overlap along said first axis or said second axis.

13. The computer readable medium of claim 12, wherein said shifting comprises identifying a macro in said set of overlapping macros as a candidate for shifting if at least one positive value greater than said extent of overlap for any of said first cumulative distance, said second cumulative distance, said third cumulative distance or said fourth cumulative distance associated with said macro is identified, wherein said shifting is done along said first axis if said extent of overlap is lesser along said first axis than said second axis, and along said second axis if said extent of overlap is lesser along said second axis than said first axis.

14. The computer readable medium of claim 13, wherein said shifting farther comprising identifying a macro in said set of overlapping macros as a candidate for said shifting if a value less than said extent of overlap is present for each of said first cumulative distance, said second cumulative distance, said third cumulative distance or said fourth cumulative distance associated with said macro, wherein said shifting is performed to a first empty area determined to be present adjacent to any macro in said set of overlapping macros, and said shifting is done to a second empty area adjacent to a macro not comprising said set of overlapping macros, if said first empty area is determined not to be present.

15. The computer readable medium of claim 14, wherein at least one macro not comprised in said one of said plurality of overlapping macros is not allowed to move.

16. The computer readable medium of claim 9, wherein said determining and said shifting are repeated until overlaps are removed from said fifth placement.

* * * * *